United States Patent [19]

Stanchina et al.

[11] Patent Number: 5,049,522

[45] Date of Patent: Sep. 17, 1991

[54] SEMICONDUCTIVE ARRANGEMENT HAVING DISSIMILAR, LATERALLY SPACED LAYER STRUCTURES, AND PROCESS FOR FABRICATING THE SAME

[75] Inventors: William E. Stanchina, Thousand Oaks; Lawrence E. Larson, Santa Monica, both of Calif.

[73] Assignee: Hughes Aircraft Company, Los Angeles, Calif.

[21] Appl. No.: 477,700

[22] Filed: Feb. 9, 1990

[51] Int. Cl.[5] .................... H01L 31/15; H01L 31/70; H01L 21/20; H01L 21/302
[52] U.S. Cl. ........................................ 437/62; 437/90; 437/54; 437/33; 148/DIG. 152
[58] Field of Search ............... 437/84, 90, 61, 62, 437/126, 938; 372/50; 357/50; 156/657; 148/DIG. 150, DIG. 152

[56] References Cited

U.S. PATENT DOCUMENTS

| 4,532,694 | 8/1985 | Kolbas | 29/569 L |
| 4,741,802 | 5/1988 | Okumura | 437/61 |
| 4,845,044 | 7/1989 | Ariyoshi et al. | 437/24 |
| 4,908,328 | 3/1990 | Hy et al. | 437/90 |
| 4,923,820 | 5/1990 | Beasom | 437/21 |

FOREIGN PATENT DOCUMENTS

| 0095633 | 6/1982 | Japan | 437/90 |
| 0066459 | 4/1985 | Japan | 357/42 |
| 0230333 | 5/1985 | Japan | 437/62 |
| 0018785 | 1/1987 | Japan | 372/50 |
| 0172457 | 7/1988 | Japan | 437/61 |

OTHER PUBLICATIONS

An Analog/Digital BCDMOS Technology with Dielectric Isolation-Devices and Processes, 35(2), 230, 1988, Chih-Yuan Lu et al, IEEE Trans. on Electron Devices.
"Optoelectronic Integrated Receivers on InP Substrates by Organometallic Vapor Phase Epitaxy", by G. Sasaki et al, in Journal of Lightweight Technology, vol. 7, No. 10, pp. 1510-1513 (Oct. 1989).
"GaAs/GaAlAs Selective MOCVD Epitaxy and Planar Ion-Implantation Technique for Complex Integrated Optelectronic Circuit Applications", by M. Kim et al, in IEEE Electron Device Letters, vol. EDL-5, No. 8, pp. 306-309 (Aug. 1984).
"A Novel Planarization Technique for Optoelectronic Integrated Circuits and Its Application to a Monolithic AlGaAs/GaAs p-i-n FET", by S. Miura et al, in IEEE Transactions on Electron Devices, vol. ED-34, No. 2, pp. 241-246 (Feb. 1987).
"Monolithic Integration of HEMTs and HBTs on an InP Substrate and Its Application to OEICs", by G. Sasaki et al, presented at the International Electron Devices Meeting, Dec. 3-6, 1989, pp. 30.8.1-30.8.3.

*Primary Examiner*—Olik Chaudhuri
*Assistant Examiner*—L. Trinh
*Attorney, Agent, or Firm*—Paul M. Coble; W. K. Denson-Low

[57] ABSTRACT

A depression is formed by mesa etching or the like in the surface of an insulative substrate. A first semiconductive layer structure such as a PNP layer structure is formed on the surface including the depression. An electrically insulative isolation layer is formed on the first layer structure, and then a second layer structure such as an NPN layer structure is formed on the isolation layer. The area over the depression is then masked, and the second layer structure and isolation layer are etched away from the first layer structure over areas of the surface external of the depression. Where the thicknesses of the first and second layer structures are equal, and the depth of the depression is equal to the combined thicknesses of the first layer structure and the isolation layer, the second layer structure laterally external of the depression will be coplanar with the first layer structure over the depression. Dissimilar microelectronic devices such as complementary heterojunction bipolar transistors may be formed in the exposed surfaces of the first and second layer structures respectively by common and simultaneous processing.

14 Claims, 3 Drawing Sheets

SEMICONDUCTIVE ARRANGEMENT HAVING DISSIMILAR, LATERALLY SPACED LAYER STRUCTURES, AND PROCESS FOR FABRICATING THE SAME

BACKGROUND OF THE INVENTION

1. Field of the Invention

The present invention generally relates to the fabrication of microelectronic integrated circuit devices in semiconductive materials, and more specifically to a semiconductive arrangement having dissimilar, laterally spaced layer structures which enable the fabrication of dissimilar devices therein.

2. Description of the Related Art

It is desirable in the production of microelectronic circuits to integrate as many devices as possible onto a single integrated circuit chip. This goal is made difficult by the fact that the many dissimilar devices which have been developed and are theoretically available for use often have conflicting characteristics. One type of device may function optimally when fabricated in a certain material structure, whereas another type of device may be completely inoperative in the same material structure.

The integration of complementary heterojunction bipolar transistors (HBTs) is a primary example, in that the PNP and NPN transistors have dissimilar epitaxial structures. However, the problem is common to integration of many other types of dissimilar devices, such as varactor diodes and HBTs, semiconductor lasers and HBTs, photodiodes and HBTs, various devices with field effect transistors (FETs) and high electron mobility transistors (HEMTs), etc.

Previous approaches to the integration of dissimilar devices include fabrication of the devices in a vertically stacked arrangement as disclosed in an article entitled "Optoelectronic Integrated Receivers on InP Substrates by Organometallic Vapor Phase Epitaxy", by G. Sasaki et al, in Journal of Lightwave Technology, Vol. 7, no. 10, pp. 1510-1513 (Oct. 1989). However, this type of process is disadvantageous in that it requires fine line photolithography, etching, contact metallization, planarization, and interconnect metallization over a wafer which has a large elevation difference between the lowest point (usually a semi-insulating substrate isolating the lower devices), and the highest point (usually the top electrode of the upper devices). These height differences can make processing extremely difficult or even impossible.

A second approach requires selective area epitaxial growth of at least one of the epitaxial structures. An example is disclosed in an article entitled "GaAs/GaAlAs Selective MOCVD Epitaxy and Planar Ion-Implantation Technique for Complex Integrated Optoelectronic Circuit Applications", by M. Kim et al, in IEEE Electron Device Letters, vol. EDL-5, no. 8, pp. 306-309 (Aug. 1984). This technique is disadvantageous in that it is difficult and time consuming, and further in that it jeopardizes the quality of the selective area epitaxial material.

A relevant variation on the selective area epitaxy approach is disclosed in an article entitled "A Novel Planarization Technique for Optoelectronic Integrated Circuits and Its Application to a Monolithic AlGaAs/GaAs p-i-n FET", by S. Miura et al, in IEEE Transactions on Electron Devices, vol. ED-34, no. 2, pp. 241-246 (Feb. 1987). This reference teaches how to embed a device in a well formed in the surface of a substrate or wafer, and planarize the surface of the device with the surface of the surrounding substrate. Subsequent to fabrication of the embedded device, selective area epitaxy is used to form epitaxial layer structures on other areas of the substrate for fabrication of additional devices.

SUMMARY OF THE INVENTION

The present invention provides a process for fabricating a semiconductive arrangement having dissimilar semiconductive layer structures which are laterally spaced from each other, in which microelectronic devices having characteristic requirements corresponding to the respective layer structures may be fabricated. This enables the monolithic fabrication of complementary (i.e. PNP and NPN) HBTs, or other dissimilar devices such as optoelectronic and electronic devices.

Major advantages of the present process are that only one epitaxial growth run is necessary, and that the two types of devices can be fabricated to be coplanar or nearly so depending on their exact structures. The requirement for only a single growth run enhances the quality of the epitaxial material for both devices, while allowing both devices to be individually optimized. The coplanarity simplifies the device fabrication steps of photolithography, planarization, and interconnect processing over nonplanar approaches.

In accordance with the present invention, a depression is formed by mesa etching or the like in the surface of an insulative substrate. A first semiconductive layer structure such as a PNP layer structure is formed on the surface including the depression. An electrically insulative isolation layer is formed on the first layer structure, and then a second layer structure such as an NPN layer structure is formed on the isolation layer. The area over the depression is then masked, and the second layer structure and isolation layer are etched away from the first layer structure over areas of the surface external of the depression. Where the thicknesses of the first and second layer structures are equal, and the depth of the depression is equal to the combined thicknesses of the first layer structure and the isolation layer, the second layer structure laterally external of the depression will be coplanar with the first layer structure over the depression. Dissimilar microelectronic devices such as complementary heterojunction bipolar transistors may be formed in the exposed surfaces of the first and second layer structures respectively by common and simultaneous processing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
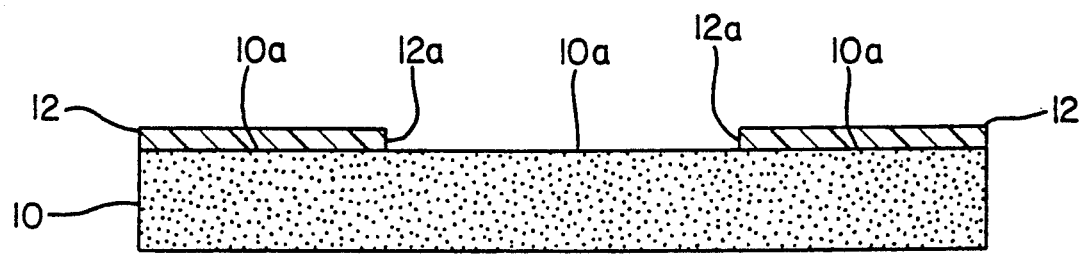
FIGS. 1 to 7 are simplified sectional views illustrating a process for fabricating a semiconductive arrangement embodying the present invention.

Referring now to FIG. 1 of the drawing, a substrate 10 is provided in the form of a wafer of material which is preferably electrically insulative, or semi-insulative, although the invention is not so limited. The material of the substrate 10 may be selected from a wide range of alternatives, depending on the devices which are to be fabricated, and the overall requirements of the system. Representative examples of materials which may be used for the substrate 10 include silicon, silicon-on-insulator (SOI), silicon-on-sapphire (SOS), GaAs, InAlAs, InP, etc.

Further illustrated in FIG. 1 is a mask in the form of a layer 12 of resist material which is deposited on a surface 10a of the substrate 10, and formed with a hole 12a therethrough. Although only one hole 12a is shown in the drawing for simplicity of presentation of the principles of the invention, in a practical application a large number of holes 12a will be formed through the resist layer 12 in selected locations corresponding to the design of a desired integrated circuit. The resist layer 12 and hole 12a are formed by a suitable process such as photolithography.

Figure 2:
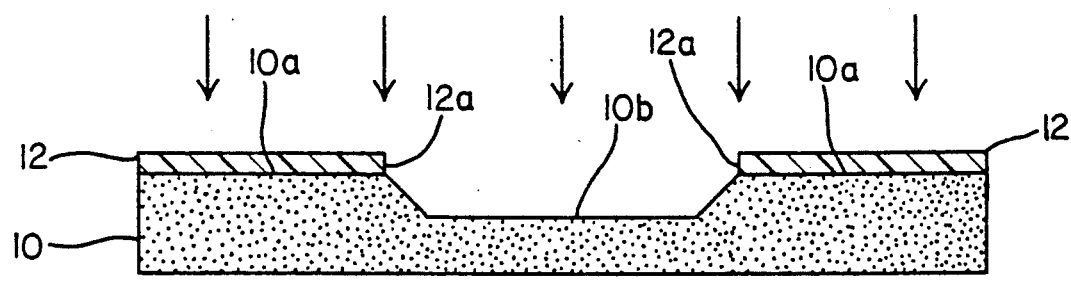

In the next step of the process, illustrated in FIG. 2, a depression 10b is formed in the surface 10a using, for example, a conventional mesa etching process. A suitable substance which etches the material of the substrate 10 but not the resist layer 12 is applied as indicated by arrows to form the depression 10b to a selected depth. Although the depression 10b is preferably formed by removal of material by etching, the invention is not so limited, and the depression 10b may alternatively be formed by means such as plastically compressing the surface 10a of the substrate 10.

Figure 3:
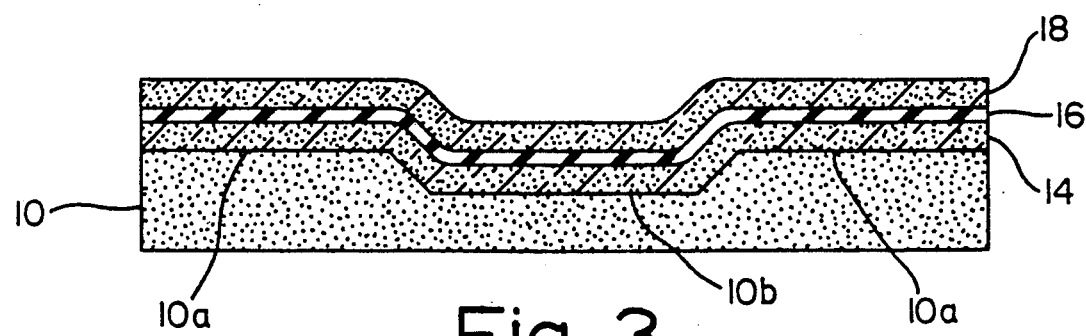

In the step of FIG. 3, the resist layer 12 is removed, and a first semiconductive layer structure 14 is formed on the surface 10a of the substrate 10 including the depression 10b. An electrically insulative isolation layer 16 is formed on the first layer structure 14, and a second semiconductive layer structure 18 is formed on the isolation layer 16. The layers 14, 16, and 18 are advantageously formed in accordance with the present invention by a suitable epitaxial deposition process in a single growth run.

The layer structures 14 and 18 are formed of dissimilar materials, and may each include a single homogeneous layer of material, two or more layers of different materials which define semiconductor junctions therebetween, a single layer of material with two or more differently doped strata or sublayers which define semiconductor junctions therebetween, or a combination thereof. Where the present invention is applied to fabricate a complementary HBT structure, the first layer structure 14 will include one of a PNP and an NPN layer structure, and the second layer structure 18 will include the other of a PNP and the NPN layer structure.

The isolation layer 16 is designed to electrically isolate the layer structures 14 and 18 from each other. The layer 16 may be substantially completely electrically insulative, or partially electrically insulative, as long as the electrical resistivity thereof is sufficiently high to provide the required isolation function. In a preferred, but exemplary material system which is especially suited to the fabrication of complementary HBTs, the layer structures 14 and 18 may be formed of AlGaAs or GaAs, and the isolation layer 16 may be formed of low temperature GaAs. Another preferred combination of materials includes low temperature InAlAs for the isolation layer 16, and InAlAs, InGaAs, or InP for the layer structures 14 and 18.

Figure 4:
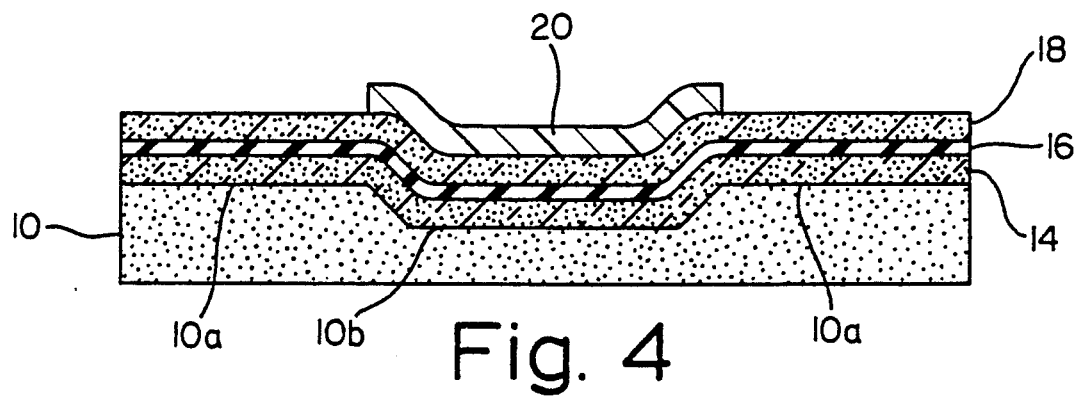

In the next step of the process, illustrated in FIG. 4, a layer 20 of resist material is formed only over the area of the depression 10b by photolithography or the like, leaving the areas over the surface 10a laterally external of the depression 10b exposed. In the next step of FIG. 5, a substance which etches the materials of the layers 16 and 18, but not the resist layer 20, is applied as indicated by arrows. The etchant substance may be selected to etch, or not affect, the material of the first layer structure 14, as desired in a particular application. The resist layer 20 acts as a mask, such that the second layer structure 18 and isolation layer 16 are etched away from the first layer structure 14 over the areas of the surface 10a laterally external of the resist layer 20. As further illustrated in FIG. 5, the etchant substance may undercut the peripheral areas of the resist layer 20, or remove a controlled amount of the layers 16 and 18 from under the edges of the resist layer 20, if desired.

Figure 5:
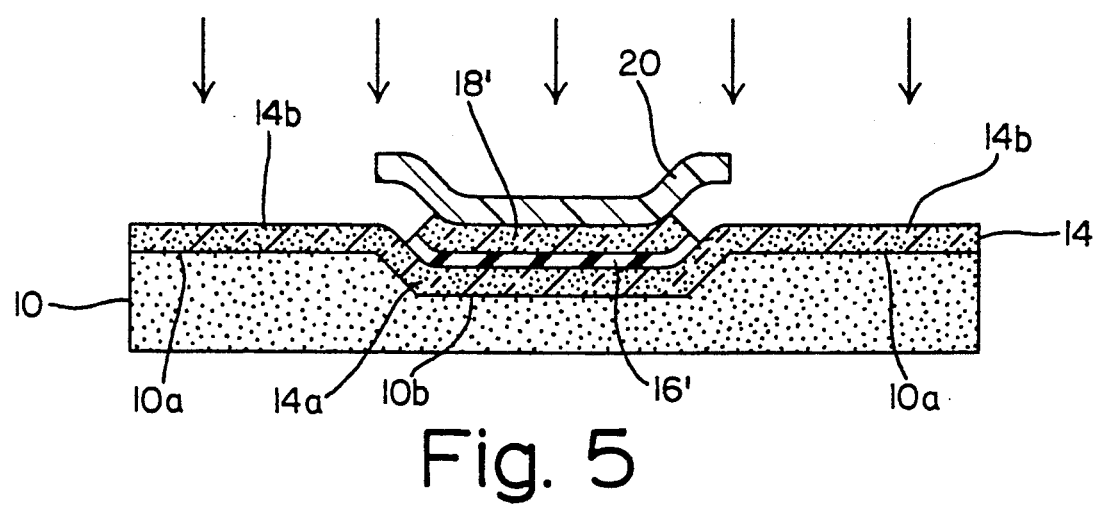
Figure 6:
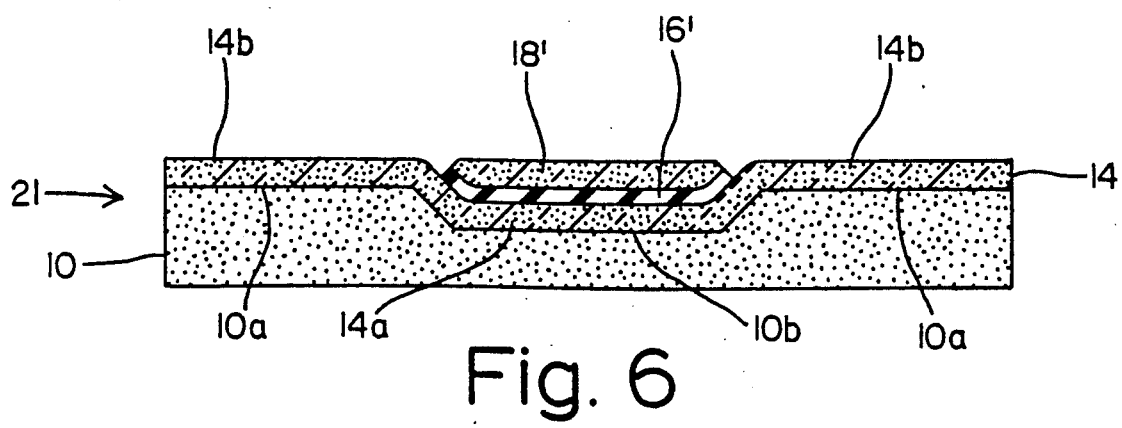

In the next step of FIG. 6, the resist layer 20 is removed, producing a semiconductive arrangement 21 embodying the present invention which is available for the fabrication of microelectronic devices therein. With reference also being made to FIG. 5, the arrangement 21 includes the substrate 10, a first portion 14a of the first layer structure 14 formed in the depression 10b, and a second portion 14b of the first layer structure 14 formed on areas of the surface 10a laterally external of the depression 10b. A portion of the isolation layer 16, which was not removed in the step of FIG. 5, remains on the first portion 14a of the layer structure 14 in the depression 10b, as designated at 16'. A portion of the second layer structure 18, which was not removed in the step of FIG. 5, remains on the isolation layer 16' as designated at 18'.

Figure 7:
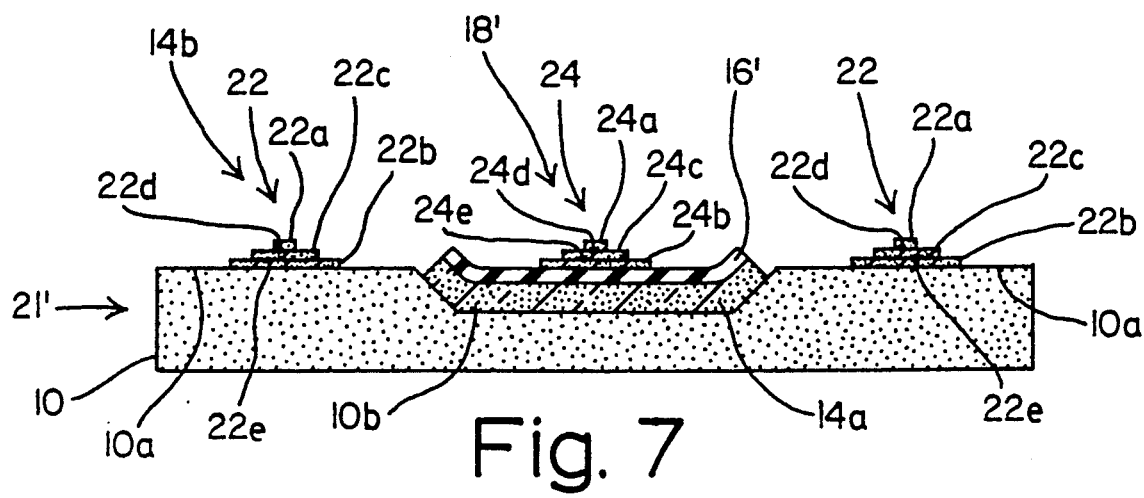

FIG. 7 illustrates an example of the arrangement 21, here designated as 21', after the fabrication of microelectronic devices in the semiconductive layer structural areas 14b and 18'. Taking for example a complementary HBT structure, in which the first layer structure 14 has a PNP type epitaxial structure and the second layer structure 18 has an NPN type epitaxial structure, PNP type HBTs 22 may be fabricated in the first layer structural portion 14b as illustrated. Each PNP type HBT 22 includes P-type layers 22a and 22b, which sandwich an N-type layer 22c therebetween. A semiconductor junction 22d is defined between the layers 22a and 22c, and a semiconductor junction 22e is defined between the layers 22b and 22c.

An NPN type HBT 24 may be fabricated in the portion 18' as illustrated. Each NPN type HBT 24 includes N-type layers 24a and 24b, which sandwich a P-type layer 24c therebetween. A semiconductor junction 24d is defined between the layers 24a and 24c, and a semiconductor junction 24e is defined between the layers 24b and 24c.

It will be noted that the first portion 14a of the first layer structure 14, and the portion 16' of the isolation layer 16, which remain in the depression 10b after completion of the arrangement 21, do not constitute functional areas of the arrangement. These layers were formed to enable fabrication of the functional portions 14b and 18' of the arrangement 21 in a single epitaxial growth run, and are unused thereafter. Although present, the portion 14a does not have any detrimental effect on the arrangement 21, since it is separated from the portion 18' by the isolation layer portion 16', which is electrically inert. This electrically inert layer 16' can, however, electrically isolate NPN HBT's 24 from each other when there is more than one fabricated in the same epitaxial portion 18'.

The processing steps for fabrication and interconnection of the microelectronic devices in the arrangement 21 are greatly facilitated by making the portion 14b of the first layer structure 14 external of the depression 10b coplanar with the portion 18' of the second layer structure 18 which is formed over the depression 10b. The lower surfaces of the portions 14b and 18' are made coplanar by forming the depression 10b to a depth equal to the combined thicknesses of the layers 14 and 16. The upper surfaces of the portions 14b and 18' are made coplanar by further forming the layers 14 and 18 to equal thicknesses. In this case, the etching step of FIG. 5 is controlled such as to make the upper surface of the portion 14b coplanar with the upper surface of the portion 18'.

Although the portions 14b and 18' are preferably made completely coplanar, with the upper and lower surfaces thereof lying in respective common planes, the scope of the present invention is not so limited. The upper and lower surfaces of the portions 14b and 18' may both be noncoplanar and still enable the arrangement 21 to be advantageously fabricated using a single epitaxial growth run. As a further example of a modified configuration of the invention, it is possible to make the upper surfaces of the portions 14b and 18' coplanar, while the lower surfaces thereof are non-coplanar. The mathematical constraint for this alternative is that the depth of the depression 10b plus the thickness of the first layer structure 14 be equal to the sum of the thicknesses of the first layer structure 14, the isolation layer 16, and the second layer structure 18.

The present invention enables the fabrication of laterally spaced, dissimilar layer structures which may differ widely in thickness as well as material. For example, a semiconductor diode laser structure having a thickness on the order of 2 microns can be integrated with a HEMT structure having a much smaller thickness on the order of 2000 angstroms.

Figure 8:
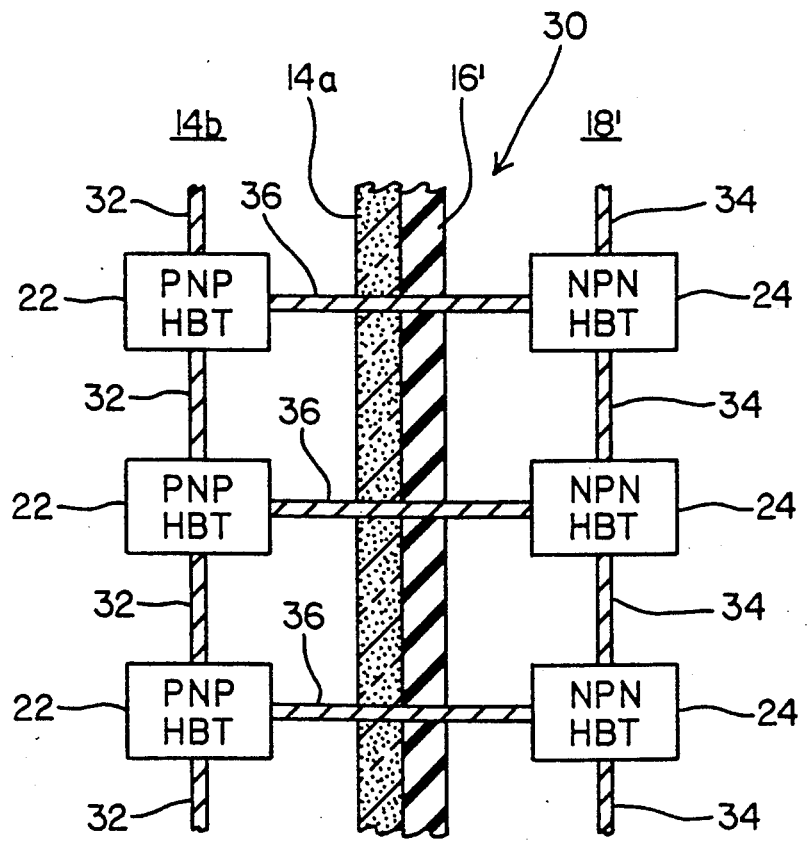
FIG. 8 is a simplified diagram illustrating a preferred configuration of microelectronic devices fabricated in the present arrangement.

FIG. 8 illustrates a preferred arrangement for the fabrication of complementary HBTs in a semiconductive arrangement of the present invention using conventional mesa transistor processing techniques. The reference numeral 30 designates a transition area between adjacent layer structure portions 14b and 18', which are formed as elongated strips. The PNP type HBTs 22 are formed in a vertical column in the portion 14b leftward of the transition area 30 as viewed in the drawing, whereas the NPN type HBTs are similarly formed righwardly of the transition area 30. The HBTs 22 may be interconnected by metallizations 32, whereas the HBTs 24 may be interconnected by metallizations 34. In addition, the HBTs 22 may be interconnected with the HBTs 24 by metallizations 36 which extend across the transition area 30. This configuration constitutes a "gate array" arrangement, providing the desired complementary circuits.

Where the layer structure portions 14b and 18' are coplanar, the PNP and NPN type HBTs can be fabricated by common and simultaneous processing. For the specific case of InAlAs, InGaAs, or InP HBTs, even the P-type and N-type ohmic contacts can be made utilizing the same metallization steps. Device interconnection as illustrated in FIG. 8 may be accomplished using standard polyimide planarization, etching of via holes through the polyimide to the HBT contacts, and standard patterning of the interconnect metal.

While several illustrative embodiments of the invention have been shown and described, numerous variations and alternate embodiments will occur to those skilled in the art, without departing from the spirit and scope of the invention. For example, although the invention has been described and illustrated as being used to fabricate two dissimilar layer structures in a semiconductive arrangement, the invention is not so limited, and may be used to fabricate three or more dissimilar layer structures by extrapolation of the basic process. Accordingly, it is intended that the present invention not be limited solely to the specifically described illustrative embodiments. Various modifications are contemplated and can be made without departing from the spirit and scope of the invention as defined by the appended claims.

We claim:

1. A process for fabricating a semiconductive arrangement, comprising the steps of:
   (a) providing a substrate;
   (b) forming a depression in a surface of the substrate;
   (c) forming a first semiconductive layer structure on the surface including the depression;
   (d) forming an electrically insulative isolation layer on the first layer structure;
   (e) forming a second semiconductive layer structure on the isolation layer; and
   (f) removing the second layer structure and isolation layer from the first layer structure over areas of the surface laterally external of the depression, such that the first layer structure remains on the substrate in said areas.

2. A process as in claim 1, in which step (b) comprises forming the depression with a substantially uniform depth.

3. A process as in claim 1, in which step (b) comprises forming the depression to a depth which is substantially equal to the combined thicknesses of the first layer structure and the isolation layer.

4. A process as in claim 1, in which step (b) comprises forming the depression by etching.

5. A process as in claim 1, in which step (b) comprises the substeps of:
   (g) forming a resist layer on the surface with an hole therethrough over the area of the surface in which the depression is to be formed; and
   (h) etching the substrate through the hole using a substance that does not etch the resist layer.

6. A process as in claim in which step (f) comprises the substeps of:
   (g) forming a resist layer on the second layer structure over the depression; and
   (h) etching away the second layer structure and isolation layer laterally external of the resist layer using a substance that does not etch the resist layer.

7. A process as in claim 1, further comprising the step of:
   (g) forming first and second dissimilar microelectronic devices in exposed areas of the first and second layer structures respectively.

8. A process as in claim 7, in which step (g) comprises forming the first and second microelectronic devices by common and simultaneous processing.

9. A process as in claim 1, in which steps (c) and (e) comprise forming the first and second layer structures of first and second dissimilar semiconductive materials respectively.

10. A process as in claim 1, in which steps (c) and (e) comprise forming the first and second layer structures by epitaxial deposition.

11. A process as in claim 1, in which:
step (c) comprises forming the first layer structure of first and second differently doped semiconductive layers which define a first junction therebetween; and
step (e) comprises forming the second layer structure of third and fourth differently doped semiconductive layers which define a second junction therebetween, and are dissimilar to the first and second semiconductive layers respectively.

12. A process as in claim 1, in which:
step (c) comprises forming the first layer structure as one of a PNP and an NPN semiconductive layer structure; and
step (e) comprises forming the second layer structure as the other of a PNP and NPN semiconductive layer structure.

13. A process as in claim 1, in which:
step (b) comprises forming the depression to a depth which is substantially equal to the combined thicknesses of the first layer structure and the isolation layer;
steps (c) and (e) comprise forming the first and second layer structures with equal thicknesses respectively; and
step (f) comprises controlling removal of the second layer structure and isolation layer such that the first layer structure over said areas of the surface laterally external of the depression is substantially coplanar with the second layer structure over the depression.

14. A process as in claim 1, in which step (a) comprises providing the substrate of an electrically insulative material.

* * * * *